(12) United States Patent
Mojumder et al.

(10) Patent No.: US 9,424,909 B1
(45) Date of Patent: Aug. 23, 2016

(54) STATIC RANDOM ACCESS MEMORY (SRAM) ARRAYS HAVING SUBSTANTIALLY CONSTANT OPERATIONAL YIELDS ACROSS MULTIPLE MODES OF OPERATION

(71) Applicant: QUALCOMM Incorporated, San Diego, CA (US)

(72) Inventors: Niladri Narayan Mojumder, San Diego, CA (US); Ping Liu, San Diego, CA (US); Stanley Seungchul Song, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/659,937

(22) Filed: Mar. 17, 2015

(51) Int. Cl.
*G11C 11/00* (2006.01)
*G11C 11/417* (2006.01)
*G06F 17/50* (2006.01)
*G11C 11/412* (2006.01)

(52) U.S. Cl.
CPC .......... *G11C 11/417* (2013.01); *G06F 17/5068* (2013.01); *G11C 11/412* (2013.01)

(58) Field of Classification Search
CPC ... G11C 11/412; G11C 11/413; G11C 11/419
USPC ................................ 365/154, 189.05, 189.09
See application file for complete search history.

(56) References Cited

U.S. PATENT DOCUMENTS

| | | | |
|---|---|---|---|
| 7,903,483 B2 | 3/2011 | Russell et al. | |
| 8,315,117 B2 | 11/2012 | Zhang et al. | |
| 8,427,896 B1 | 4/2013 | Agarwal et al. | |
| 8,483,006 B1 | 7/2013 | Chou et al. | |
| 8,582,351 B2 | 11/2013 | Arsovski et al. | |
| 8,630,142 B2 | 1/2014 | Nii et al. | |
| 2004/0155281 A1* | 8/2004 | Osada ................. | G11C 11/412 257/315 |
| 2007/0133326 A1 | 6/2007 | Ishikura et al. | |
| 2008/0055967 A1 | 3/2008 | Houston et al. | |
| 2009/0141536 A1* | 6/2009 | Gonzalez ............ | G11C 11/413 365/154 |
| 2009/0213641 A1 | 8/2009 | Park et al. | |
| 2010/0191385 A1* | 7/2010 | Goodnow ............. | G06F 1/305 700/291 |
| 2011/0085389 A1 | 4/2011 | Khellah et al. | |
| 2013/0064004 A1 | 3/2013 | Garg et al. | |
| 2014/0050017 A1* | 2/2014 | Otto ..................... | G11C 11/413 365/154 |

OTHER PUBLICATIONS

International Search Report and Written Opinion for PCT/US2016/020211, mailed Jun. 9, 2016, 13 pages.

* cited by examiner

*Primary Examiner* — Connie Yoha
(74) *Attorney, Agent, or Firm* — Withrow & Terranova, PLLC

(57) ABSTRACT

Aspects disclosed include static random access memory (SRAM) arrays having substantially constant operational yields across multiple modes of operation. In one aspect, a method of designing SRAM arrays with multiple modes operation is provided. The method includes determining performance characteristics associated with each mode of operation. SRAM bit cells configured to operate in each mode of operation are provided to the SRAM array. SRAM bit cells are biased to operate in a mode of operation using dynamic adaptive assist techniques, wherein the SRAM bit cells achieve a substantially constant operational yield across the modes. The SRAM bit cells have a corresponding type, wherein the number of SRAM bit cell types in the method is less than the number of modes of operation. Thus, each SRAM array may achieve a particular mode of operation without requiring a separate SRAM bit cell type for each mode, thereby reducing costs.

23 Claims, 8 Drawing Sheets

STATIC RANDOM ACCESS MEMORY (SRAM) ARRAYS HAVING SUBSTANTIALLY CONSTANT OPERATIONAL YIELDS ACROSS MULTIPLE MODES OF OPERATION

BACKGROUND

I. Field of the Disclosure

The technology of the disclosure relates generally to static random access memory (SRAM) arrays, and particularly to designing lower power, higher performance SRAM arrays.

II. Background

Mobile communications devices have become common in contemporary society. The prevalence of these mobile devices is driven in part by the wide range of functionality provided by such devices. To achieve this wide range of functionality, mobile devices are designed to achieve lower power operation for extended battery life, while also supporting higher performance, higher power operation. The memory employed within such devices plays an important role in determining the success of achieving both lower power and higher performance operation.

In this regard, different types of memory exist, each possessing certain unique features. For example, static random access memory (SRAM) is a type of memory that can be employed in mobile communications devices. SRAM can store data without the need to periodically refresh the memory, unlike dynamic read access memory (DRAM), for example. An SRAM array contains a plurality of SRAM bit cells (also referred to as "bit cells") organized in rows and columns. For any given row in an SRAM array, each column of the SRAM array includes an SRAM bit cell in which a single data value is stored. Access to read or write a desired SRAM bit cell row is controlled by wordlines, while data values are read from or written to particular SRAM bit cells using corresponding bitlines. An SRAM array can be designed to operate with lower power consumption, wherein such designs also operate with lower performance. Alternatively, an SRAM array can be designed to achieve higher performance operation, thus requiring higher power consumption.

An SRAM array designed to a particular performance metric employs SRAM bit cells of a corresponding design. For example, higher performance SRAM arrays employ SRAM bit cells specifically designed to operate at a higher performance level. Further, lower power SRAM arrays employ SRAM bit cells specifically designed to operate at a lower power level. To achieve varying power and performance levels in SRAM bit cells, SRAM bit cells included in an SRAM array can be designed to operate under specific parameters, such as a particular threshold voltage, number of pins, placement of pins, and metal area. In this manner, SRAM bit cells employed in lower power SRAM arrays operate according to particular design parameters that are different from parameters associated with SRAM bit cells employed in higher performance SRAM arrays. However, requiring a different SRAM bit cell design for each type of SRAM array may result in higher costs associated with design and manufacturing. Therefore, it would be advantageous to provide SRAM arrays that achieve a wide range of functionality at reduced costs.

SUMMARY OF THE DISCLOSURE

Aspects disclosed in the detailed description include static random access memory (SRAM) arrays having substantially constant operational yields across multiple modes of operation. In one aspect, an exemplary method of designing an SRAM array is provided, wherein the SRAM array achieves a substantially constant operational yield (e.g., read/write limited yield) across multiple modes of operation. To design such an SRAM array, one exemplary method includes determining a set of performance characteristics associated with each mode of operation of an SRAM array. Based on these performance characteristics, SRAM bit cells configured to operate in each mode of operation are provided to the SRAM array. The SRAM bit cells may be biased to operate in a desired mode of operation using dynamic adaptive assist techniques (e.g., over-driving or under-driving a wordline, providing a bias voltage to a bitline, etc.), wherein the SRAM bit cells achieve a substantially constant operational yield across each mode of operation. In other words, the dynamic adaptive assist techniques determine the mode of operation in which the SRAM array operates (e.g., lower power, higher performance, etc.), wherein the dynamic adaptive assist techniques result in the operational yield being substantially constant in each mode of operation. Further, the SRAM bit cells have a corresponding type, wherein the type is determined based on the mode of operation in which the SRAM bit cell is designed to operate without use of the dynamic adaptive assist techniques. The number of SRAM bit cell types provided by the method is less than the number of modes of operation of the SRAM array. In other words, the method provides SRAM arrays having substantially constant operational yields across multiple modes of operation, wherein a particular mode of operation may be achieved without requiring different types of SRAM bit cells for each mode of operation. By using such a method of designing, the SRAM array may be provided at a lower cost as compared to an SRAM array employing SRAM bit cells designed to operate in one mode of operation.

In this regard, in one aspect, a method for designing an SRAM array with a substantially constant operational yield across a plurality of modes of operation is provided. The method comprises determining performance characteristics for each mode of operation of a plurality of modes of operation for an SRAM array. The method further comprises providing to the SRAM array a plurality of SRAM bit cells configured to operate in the plurality of modes of operation with a substantially constant operational yield based on one or more dynamic adaptive assist techniques, wherein the plurality of SRAM bit cells has a corresponding type, and a number of types of SRAM bit cells is less than a number of modes of operation. The method further comprises biasing each SRAM bit cell of the plurality of SRAM bit cells to operate in one or more corresponding modes of operation of the plurality of modes of operation using the one or more dynamic adaptive assist techniques.

In another aspect, an SRAM array is provided. The SRAM array comprises a biasing circuit. The SRAM array further comprises a plurality of SRAM bit cells. Each SRAM bit cell of the plurality of SRAM bit cells is configured to operate in a plurality of modes of operation with a substantially constant operational yield based on one or more dynamic adaptive assist techniques. The plurality of SRAM bit cells has a corresponding type, and a number of types of SRAM bit cells is less than a number of modes of operation. Each SRAM bit cell of the plurality of SRAM bit cells is configured to be biased by the biasing circuit to operate in one or more corresponding modes of operation of the plurality of modes of operation using the one or more dynamic adaptive assist techniques.

In another aspect, an SRAM array is provided. The SRAM array comprises a means for determining performance characteristics for each mode of operation of a plurality of modes of operation for an SRAM array. The SRAM array further comprises a means for providing to the SRAM array a plurality of SRAM bit cells configured to operate in the plurality of modes of operation with a substantially constant operational yield based on one or more dynamic adaptive assist techniques, wherein the plurality of SRAM bit cells has a corresponding type, and a number of types of SRAM bit cells is less than a number of modes of operation. The SRAM array further comprises a means for biasing each SRAM bit cell of the plurality of SRAM bit cells to operate in one or more corresponding modes of operation of the plurality of modes of operation using the one or more dynamic adaptive assist techniques.

In another aspect, a non-transitory computer-readable medium having stored thereon computer executable instructions which, when executed by a processor, cause the processor to determine performance characteristics for each mode of operation of a plurality of modes of operation for an SRAM array. The computer executable instructions further cause the processor to provide to the SRAM array a plurality of SRAM bit cells configured to operate in the plurality of modes of operation with a substantially constant operational yield based on one or more dynamic adaptive assist techniques, wherein the plurality of SRAM bit cells has a corresponding type, and a number of types of SRAM bit cells is less than a number of modes of operation. The computer executable instructions further cause the processor to bias each SRAM bit cell of the plurality of SRAM bit cells to operate in one or more corresponding modes of operation of the plurality of modes of operation using the one or more dynamic adaptive assist techniques.

DETAILED DESCRIPTION

Figure 1:
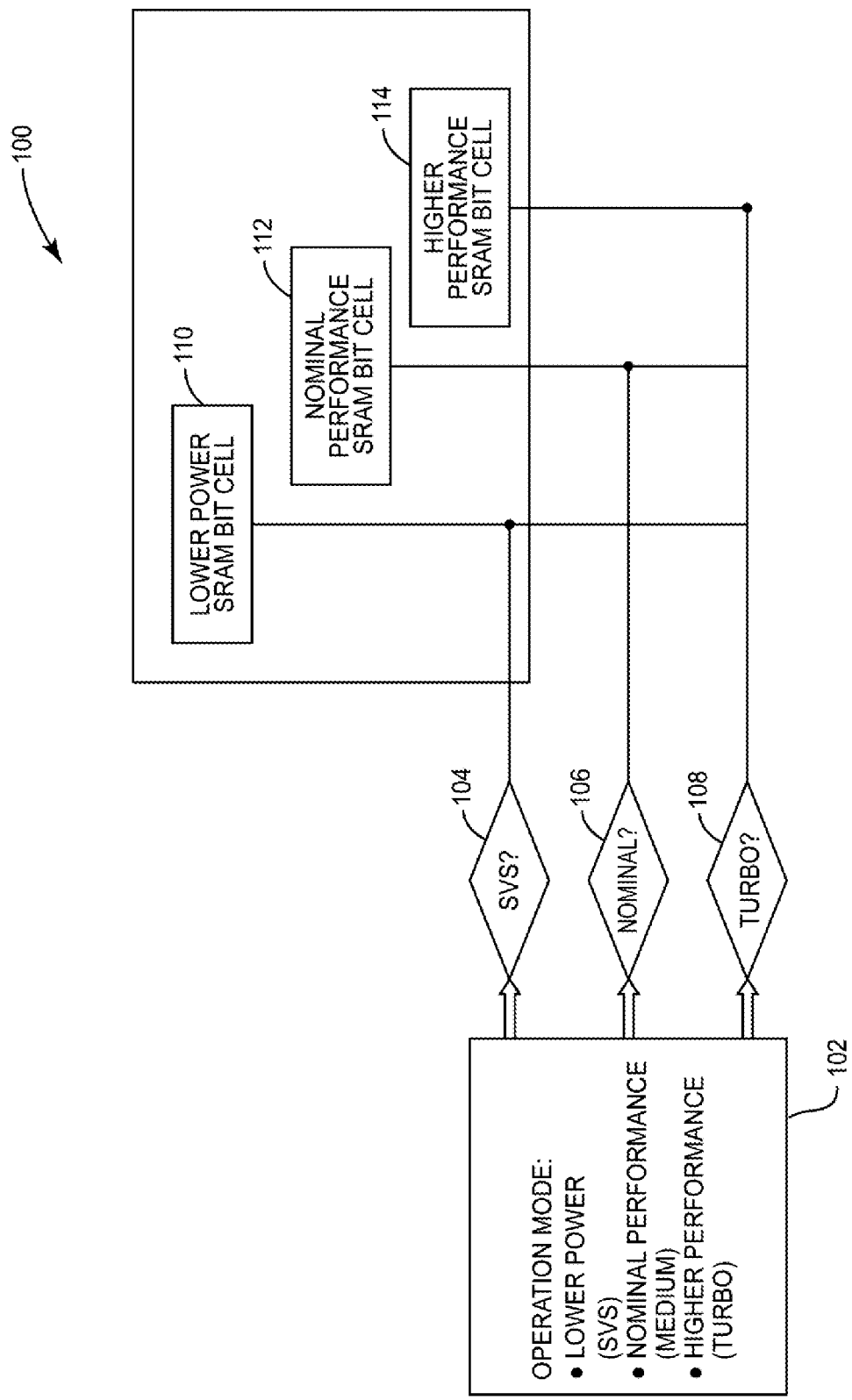
FIG. 1 is a diagram illustrating an exemplary process for designing a static random access memory (SRAM) array using a minimum voltage ($V_{MIN}$) design methodology.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include static random access memory (SRAM) arrays having substantially constant operational yields across multiple modes of operation. In one aspect, an exemplary method of designing an SRAM array is provided, wherein the SRAM array achieves a substantially constant operational yield (e.g., read/write limited yield) across multiple modes of operation. To design such an SRAM array, one exemplary method includes determining a set of performance characteristics associated with each mode of operation of an SRAM array. Based on these performance characteristics, SRAM bit cells configured to operate in each mode of operation are provided to the SRAM array. The SRAM bit cells may be biased to operate in a desired mode of operation using dynamic adaptive assist techniques (e.g., over-driving or under-driving a wordline, providing a bias voltage to a bitline, etc.), wherein the SRAM bit cells achieve a substantially constant operational yield across each mode of operation. In other words, the dynamic adaptive assist techniques determine the mode of operation in which the SRAM array operates (e.g., lower power, higher performance, etc.), wherein the dynamic adaptive assist techniques result in the operational yield being substantially constant in each mode of operation. Further, the SRAM bit cells have a corresponding type, wherein the type is determined based on the mode of operation in which the SRAM bit cell is designed to operate without use of the dynamic adaptive assist techniques. The number of SRAM bit cell types provided by the method is less than the number of modes of operation of the SRAM array. In other words, the method provides SRAM arrays having substantially constant operational yields across multiple modes of operation, wherein a particular mode of operation may be achieved without requiring different types of SRAM bit cells for each mode of operation. By using such a method of designing, the SRAM array may be provided at a lower cost as compared to an SRAM array employing SRAM bit cells designed to operate in one mode of operation.

Figure 3:
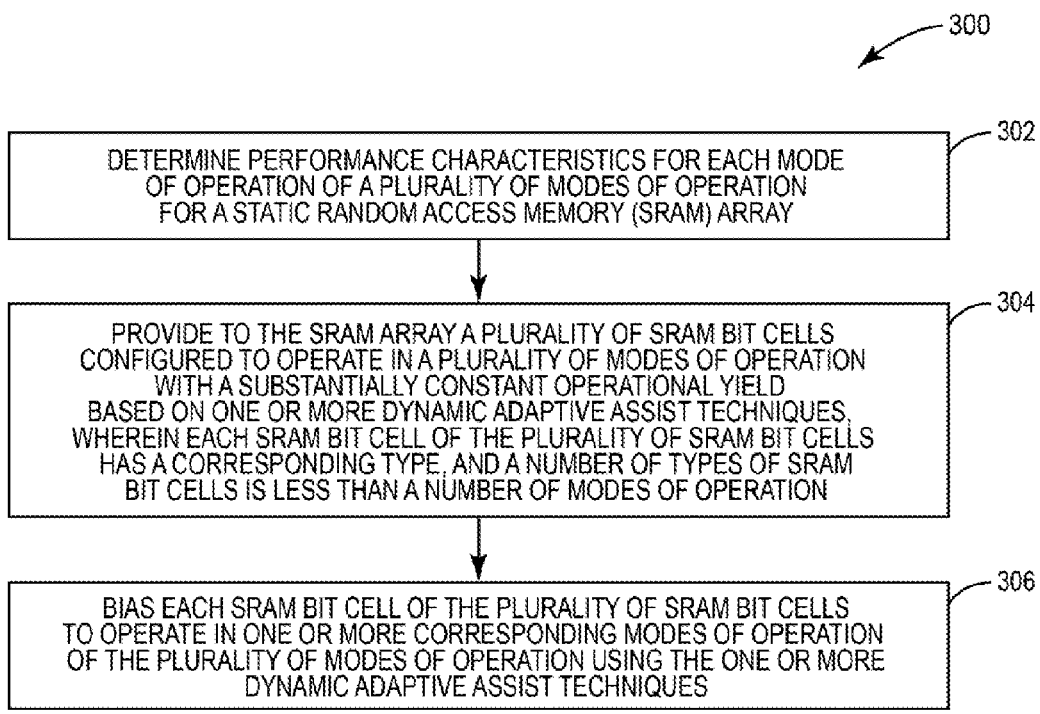
FIG. 3 is a flowchart illustrating an exemplary process for designing an SRAM array employing dynamic adaptive assist techniques to achieve multiple modes of operation, wherein the SRAM array has a substantially constant operational yield across multiple modes of operation.

Before addressing details of designing SRAM arrays having substantially constant operational yields across multiple modes of operation beginning in FIG. 3, a minimum voltage ($V_{MIN}$) SRAM array design methodology is first described. In this regard, FIG. 1 illustrates a diagram of an exemplary $V_{MIN}$ design process 100 for designing an SRAM array. The $V_{MIN}$ design process 100 provides an SRAM array that employs SRAM bit cells designed to achieve a particular mode of operation at a corresponding operation voltage according to the SRAM bit cell type. Further, each mode of operation is associated with specific power and/or performance levels. As described in more detail below, the SRAM array is configured to achieve a particular operational yield when the operation voltage is set to the $V_{MIN}$, wherein the SRAM array is designed to operate at or above the $V_{MIN}$. Notably, in the present disclosure, operational yield refers to read/write limited operational yield, wherein the operational yield is determined based on a success rate of read/write operations performed on multiple instances of the designed SRAM array.

With continuing reference to FIG. 1, the $V_{MIN}$ design process 100 includes three (3) modes of operation in which the SRAM array may be designed to operate: lower power (also referred to as supply voltage supervisor (SVS)); nominal performance (also referred to as "medium"); and higher performance (also referred to as "turbo") (block 102). The $V_{MIN}$ design process 100 determines the mode of operation in which the SRAM array is designed to operate, and employs SRAM bit cells of a corresponding type designed to operate in the desired mode. For example, the $V_{MIN}$ design process 100 determines whether the SRAM array is required to function in the lower power (SVS) mode of operation (block 104), the nominal performance (medium) mode of operation (block 106), or the higher performance (turbo) mode of operation (block 108). If the SRAM array is designed to operate in the lower power (SVS) mode of operation, the $V_{MIN}$ design process 100 provides the SRAM array with lower power SRAM bit cells (block 110). Alternatively, if the SRAM array is designed to operate in the nominal performance (medium) mode of operation, the $V_{MIN}$ design process 100 provides the SRAM array with nominal performance SRAM bit cells (block 112). Further, if the SRAM array is designed to operate in the higher performance (turbo) mode of operation, the $V_{MIN}$ design process 100 provides higher performance SRAM bit cells to the SRAM array (block 114). Thus, the $V_{MIN}$ design process 100 designs an SRAM array that includes SRAM bit cells of a corresponding type, wherein the SRAM bit cells are designed specifically to achieve the desired mode of operation of the SRAM array. In this manner, designing the SRAM array using the $V_{MIN}$ design process 100 incurs costs associated with designing and manufacturing each separate type of SRAM bit cell.

Figure 2:
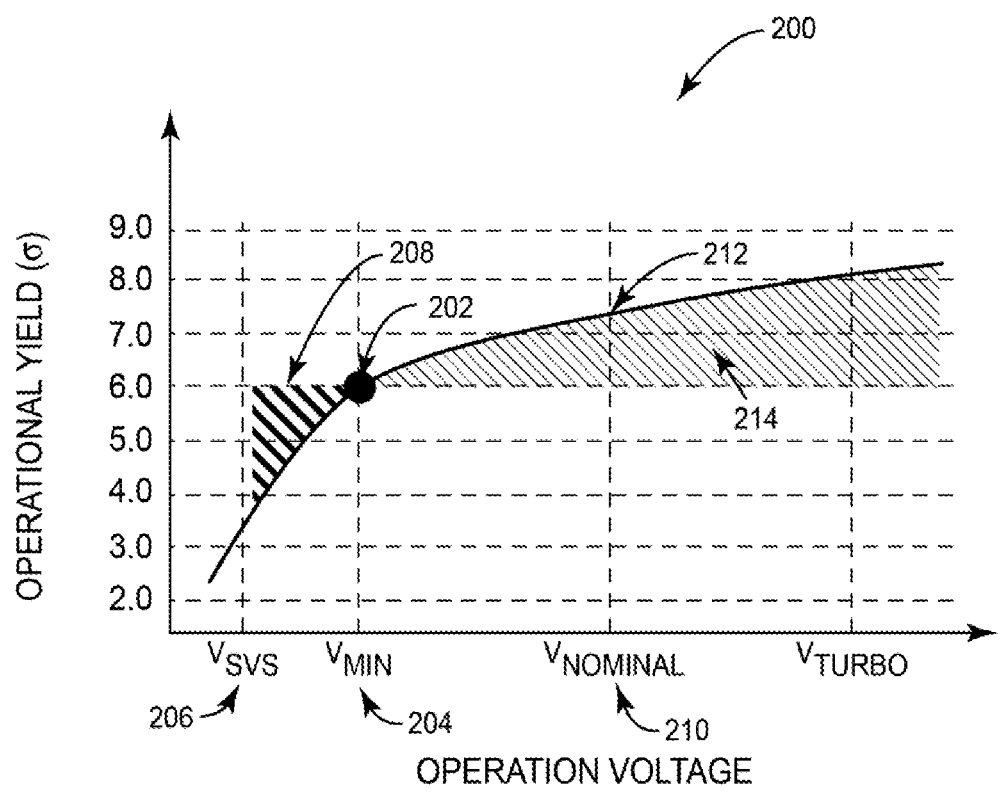
FIG. 2 is a graph illustrating unutilized operational yield of an exemplary nominal performance SRAM array designed using a $V_{MIN}$ design methodology.

In addition to the costs incurred to design and manufacture different types of SRAM bit cells wherein each type is specifically designed to satisfy a particular mode of operation, the $V_{MIN}$ design process 100 in FIG. 1 may provide SRAM arrays with excess operational yield. In this regard, FIG. 2 is a graph 200 illustrating unutilized operational yield of an exemplary nominal performance SRAM array (not shown) designed using the $V_{MIN}$ design process 100 as a function of an applied operation voltage. Notably, because the nominal performance SRAM array is designed using the $V_{MIN}$ design process 100, the nominal performance SRAM array employs nominal performance SRAM bit cells (not shown). As illustrated in the graph 200, the nominal performance SRAM array is configured to achieve a minimum required operational yield approximately equal to six sigma (6σ) (arrow 202) when the operation voltage is equal to the $V_{MIN}$ (arrow 204). In other words, design parameters of the nominal performance SRAM bit cells are configured so that the nominal performance SRAM array achieves an operational yield of 6σ at an operation voltage of $V_{MIN}$. Notably, because the $V_{MIN}$ is greater than a lower power voltage ($V_{SVS}$) (arrow 206) that corresponds to the lower power mode of operation, the nominal performance SRAM array has an inadequate operational yield 208 when the operation voltage is less than the $V_{MIN}$. Thus, the nominal performance SRAM array cannot be employed to operate in the lower power mode of operation.

With continuing reference to FIG. 2, to operate in the nominal performance mode of operation, the operation voltage of the nominal performance SRAM array is set to a nominal voltage ($V_{NOMINAL}$) (arrow 210). However, due to the design parameters of the nominal performance SRAM bit cells, the nominal performance SRAM array is configured to achieve an operational yield of approximately 7.4σ when the operation voltage is equal to the $V_{NOMINAL}$ (arrow 212). The nominal performance SRAM array has an unutilized operational yield 214 in excess of the minimum required operational yield of 6σ when the operation voltage exceeds the $V_{MIN}$. Thus, in addition to the associated design and manufacturing costs, employing the $V_{MIN}$ design process 100 to design SRAM arrays may result in excess operational yield that is not needed to achieve desired performance levels.

In this regard, FIG. 3 illustrates a process 300 for designing an SRAM array having a substantially constant operational yield across multiple modes of operation, wherein the number of SRAM bit cell types provided by the process 300 is less than the number of modes of operation of the SRAM array. In other words, the process 300 provides an SRAM array that provides a particular mode of operation without requiring different SRAM bit cell types for each mode. In aspects described herein, the SRAM array has an operational yield that is substantially constant across each mode of operation of the SRAM array, wherein the operational yield achieved in each mode of operation is within a range of plus/minus five percent (5%) of one another.

With continuing reference to FIG. 3, the process 300 includes determining performance characteristics for each mode of operation for the SRAM array (block 302). As non-limiting examples, performance characteristics may be determined for the lower power mode, the nominal performance mode, and the higher performance mode similar to the modes of operation described in the $V_{MIN}$ design process 100 in FIG. 1. The process 300 further includes providing multiple SRAM bit cells to the SRAM array, wherein the SRAM bit cells are may operate in multiple modes of operation with a substantially constant operational yield based on one or more dynamic adaptive assist techniques (block 304). For example, the SRAM bit cells may operate in the lower power mode, the nominal performance mode, and the higher performance mode, rather than operating in only one such mode. Notably, the SRAM bit cells have a corresponding type, and the number of types of SRAM bit cells provided by the process 300 is less than the number of modes of operation of the SRAM array. Further, the process 300 includes biasing each SRAM bit cell to operate in a corresponding mode of operation using the one or more dynamic adaptive assist techniques (block 306). In other words, the dynamic adaptive assist techniques may be employed to bias the SRAM bit cells to operate in a particular mode of operation, rather than requiring a separate type of SRAM bit cell for each mode of operation. As described in further detail below, non-limiting examples of the dynamic adaptive assist techniques may include under-driving or over-driving a wordline, providing a bias voltage to a bitline, or providing a bias voltage to a backgate of a transistor in the SRAM bit cell. Because the process 300 requires fewer types of SRAM bit cells than number of modes of operation, the SRAM array may be provided at a lower cost as compared to an SRAM array employing separate SRAM bit cell types designed to operate in one mode of operation, as in the $V_{MIN}$ design process 100 in FIG. 1.

Figure 4:
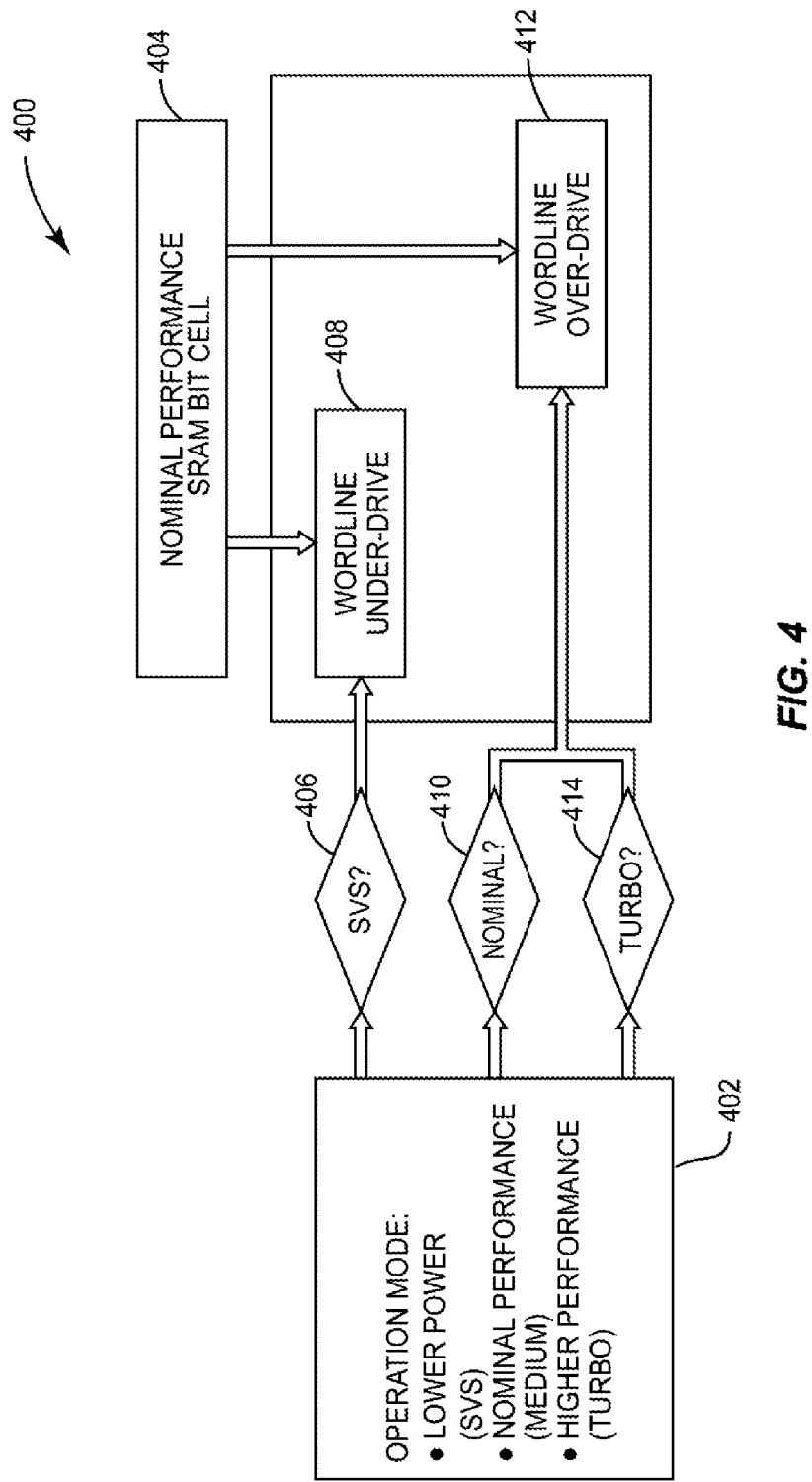
FIG. 4 is a diagram illustrating an exemplary aspect of the process for designing the SRAM array in FIG. 3.

In this regard, FIG. 4 provides a diagram illustrating a process 400 for designing an SRAM array, wherein the process 400 is an exemplary aspect of the process 300 in FIG. 3. The process 400 provides an SRAM array (not shown) that provides a particular mode of operation without requiring different SRAM bit cell types for each mode. As described in more detail below, the SRAM array is configured to achieve a substantially constant operational yield across all modes of operation. In this manner, the process 400 includes three (3) modes of operation in which the SRAM array may be designed to operate: lower power (SVS); nominal performance (medium); and higher performance (turbo) (block 402). The process 400 determines the performance characteristics for each mode of operation at a target operational yield. The process 400 provides an SRAM bit cell 404 configured to operate in each mode using dynamic adaptive assist techniques. In this aspect, the SRAM bit cell 404 has a type corresponding to the nominal performance mode. However, alternative aspects may employ an SRAM bit cell of a different type, such as lower power or higher performance. Based on the desired mode of operation of the SRAM array, the process 400 biases the SRAM bit cells 404 using the dynamic adaptive assist techniques to allow the SRAM bit cells 404 to operate in the desired mode of operation.

With continuing reference to FIG. 4, in this aspect, if the process 400 determines that the SRAM array is required to function in the lower power (SVS) mode of operation (block 406), the process 400 provides an assist of under-driving a wordline (block 408). If the process 400 determines that the SRAM array is required to function in the nominal performance (medium) mode of operation (block 410), the process 400 provides an assist of over-driving the wordline (block 412). Further, if the process 400 determines that the SRAM array is required to function in the higher performance (turbo) mode of operation (block 414), the process 400 provides an assist of over-driving the wordline (block 412), wherein the voltage used to over-drive the wordline in the higher performance mode is greater than the voltage used in the nominal performance mode. Thus, because the process 400 requires fewer types of SRAM bit cells than number of modes of operation, the SRAM array may be provided at a lower cost as compared to an SRAM array employing separate SRAM bit cell types designed to operate in one mode of operation, as in the $V_{MIN}$ design process 100 in FIG. 1.

Figure 5:
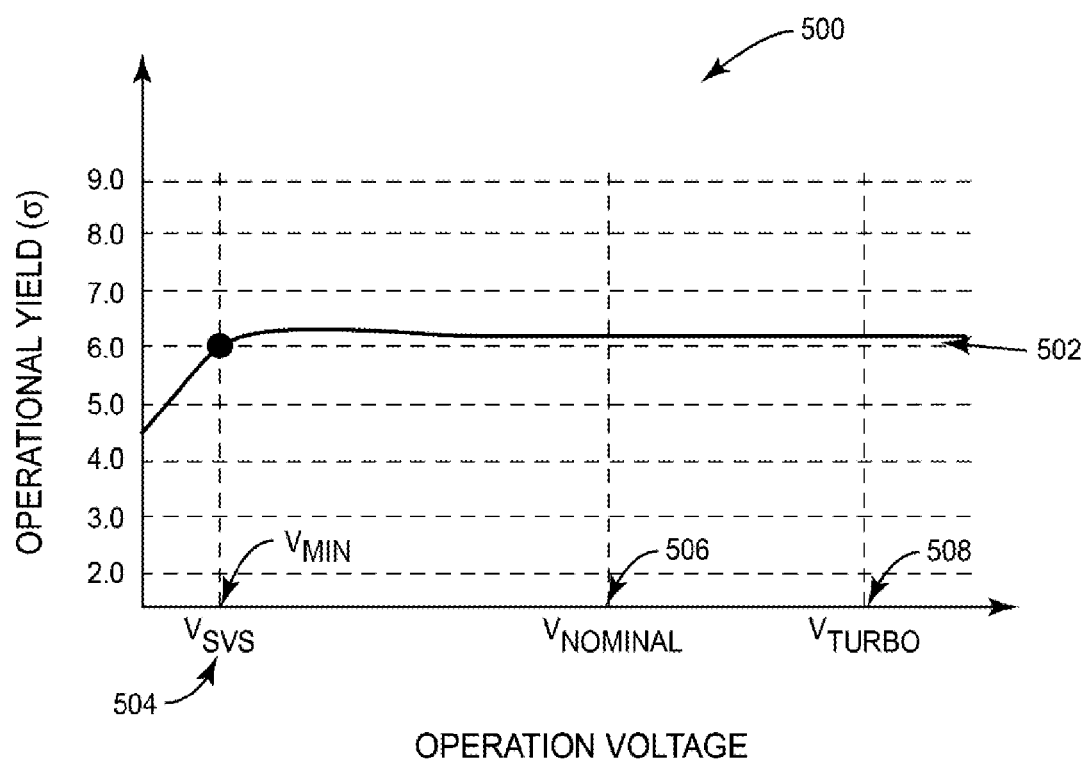
FIG. 5 is a graph illustrating improved operational yield utilization when employing the process for designing the SRAM array in FIG. 3.

In this regard, FIG. 5 is a graph 500 illustrating improved operational yield utilization of the SRAM array designed using the process 400 in FIG. 4 as a function of the applied operation voltage. As illustrated in the graph 500, the SRAM array achieves an operational yield approximately equal to six sigma (6σ) across operation voltages for each mode of operation (arrow 502). Notably, in this aspect, the process 400 achieves an operational yield that is within plus/minus five percent (5%) of 6σ. Thus, the operational yield associated with each mode operation is substantially constant across the modes of operation. In this aspect, the SRAM bit cells provided to the SRAM array in the process 400 are similar to the nominal performance SRAM bit cells previously described in FIGS. 1 and 2. However, rather than having a $V_{MIN}$ that is greater than the $V_{SVS}$ as in the nominal performance SRAM bit cells in FIG. 2, the nominal performance SRAM bit cells associated with FIG. 5 have a $V_{MIN}$ that is approximately equal to $V_{SVS}$ (arrow 504). Such a change in the $V_{MIN}$ as compared to the $V_{MIN}$ of the nominal performance SRAM bit cells in FIG. 2 is caused by the dynamic adaptive assist techniques that are applied to the SRAM array. Thus, the SRAM array is able to operate in the lower power mode with an approximately 6σ operational yield because under-driving the wordline in this aspect lowers the $V_{MIN}$ to approximately equal the $V_{SVS}$.

In addition to the lower power mode, the SRAM array also achieves the nominal performance mode of operation with an operational yield approximately equal to 6σ. The nominal performance mode is achieved by employing an operational voltage equal to $V_{NOMINAL}$ and over-driving the wordline as described in FIG. 4 (arrow 506). Thus, the SRAM array associated with the process 400 achieves an approximately 6σ operational yield in the nominal performance mode, as opposed to having the unutilized operational yield 214 in FIG. 2 incurred when employing the $V_{MIN}$ design process 100. In this manner, by over-driving the wordline to bias the nominal performance SRAM bit cells to achieve the nominal performance mode, the process 400 sacrifices the unutilized operational yield 214 in exchange for an increase in performance. As a non-limiting example, by over-driving the wordline, fewer read and write operations succeed due to bit errors caused by excess voltage in the nominal performance SRAM bit cells, resulting in a lower operational yield. However, over-driving the wordline results in faster read and write operations, causing the performance of the nominal performance SRAM bit cells to achieve the nominal performance mode of operation.

With continuing reference to FIG. 5, the SRAM array also achieves the higher performance mode of operation with an approximately 6σ operational yield. The higher performance mode is achieved by employing an operational voltage equal to $V_{TURBO}$ and over-driving the wordline as previously described (arrow 508). Similar to the nominal performance mode previously described, by over-driving the wordline to bias the nominal performance SRAM bit cells to achieve the higher performance mode, the process 400 sacrifices the unutilized operational yield 214 in FIG. 2 in excess of 6σ in exchange for an increase in performance. Thus, as a non-limiting example, by over-driving the wordline, fewer read and write operations succeed due to bit errors caused by excess voltage in the lower power SRAM bit cells, resulting in a lower operational yield. However, over-driving the wordline results in faster read and write operations, causing the performance of the nominal performance SRAM bit cells to increase to the higher performance mode of operation. Notably, in this aspect, a greater amount of the unutilized operational yield 214 is sacrificed for the higher performance mode as compared to the nominal performance mode, because a higher voltage is used to over-drive the wordline to achieve the higher performance level, thus reducing the operational yield by a greater amount. Therefore, as illustrated in FIG. 5, the process 400 enables the SRAM array to achieve multiple modes of operations when employing one (1) type of SRAM bit cell. Thus, the SRAM array may be provided at a lower cost as compared to an SRAM array employing separate SRAM bit cell types designed to operate in one mode of operation, as in the $V_{MIN}$ design process 100 in FIG. 1.

Figure 6:
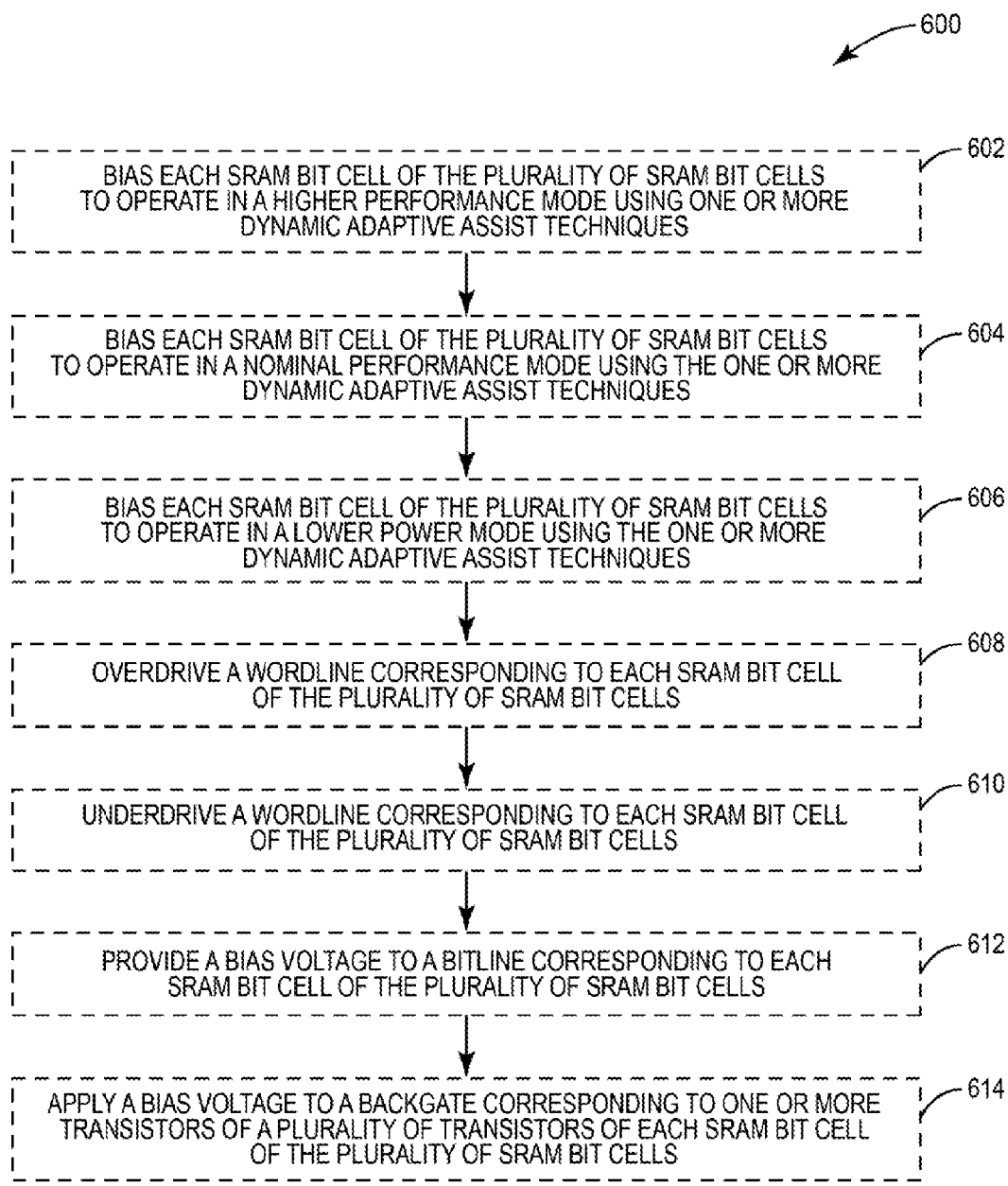
FIG. 6 is a flowchart illustrating an exemplary process of biasing each SRAM bit cell in the SRAM array when employing the process for designing the SRAM in FIG. 3.

As previously noted, SRAM bit cells within an SRAM array designed using the process 300 in FIG. 3 are biased so as to operate in multiple modes of operation using various dynamic adaptive assist techniques. In this regard, FIG. 6 illustrates an exemplary process 600 of biasing SRAM bit cells in an SRAM array when employing the process 300 in FIG. 3. Thus, the process 600 may include biasing each SRAM bit cell in the SRAM array to operate in the higher performance mode using one or more of the dynamic adaptive assist techniques (block 602). Further, the process 600 may include biasing each SRAM bit cell in the SRAM array to operate in the nominal performance mode using one or more dynamic adaptive assist techniques (block 604). The process 600 may also include biasing each SRAM bit cell in the SRAM array to operate in the lower power mode using one or more of the dynamic adaptive assist techniques (block 606). Notably, each of the above modes of operation may be achieved using various dynamic adaptive assist techniques.

In this regard, with continuing reference to FIG. 6, the process 600 may perform such biasing by over-driving the wordline corresponding to each SRAM bit cell in the SRAM array (block 608). Over-driving the wordline includes providing a higher voltage to the wordline so as to increase the speed of a read or write operation, although such over-driving may also reduce the operational yield of the SRAM array at a particular operation voltage. Further, the process 600 may achieve the desired biasing by under-driving the wordline corresponding to each SRAM bit cell, wherein a lower voltage is provided to the wordline so as to reduce the speed of a read or write operation and increase the operational yield of the SRAM array at a particular operation voltage (block 610). The process 600 may also perform such biasing by providing a bias voltage to a bitline corresponding to each SRAM bit cell in the SRAM array (also referred to as "bitline boosting") (block 612). Similar to over-driving the wordline, applying a bias voltage to the bitline may increase the speed of a write operation and reduce the operational yield. Further, the process 600 may include biasing each SRAM bit cell by applying a bias voltage to a backgate corresponding to one or more transistors in each SRAM bit cell (block 614). Similar to the other dynamic adaptive assist techniques, applying a bias voltage to the backgate may increase or decrease the speed of read or write operations according to the strength of the bias voltage, thereby reducing or improving the operational yield, respectively.

Figure 7:
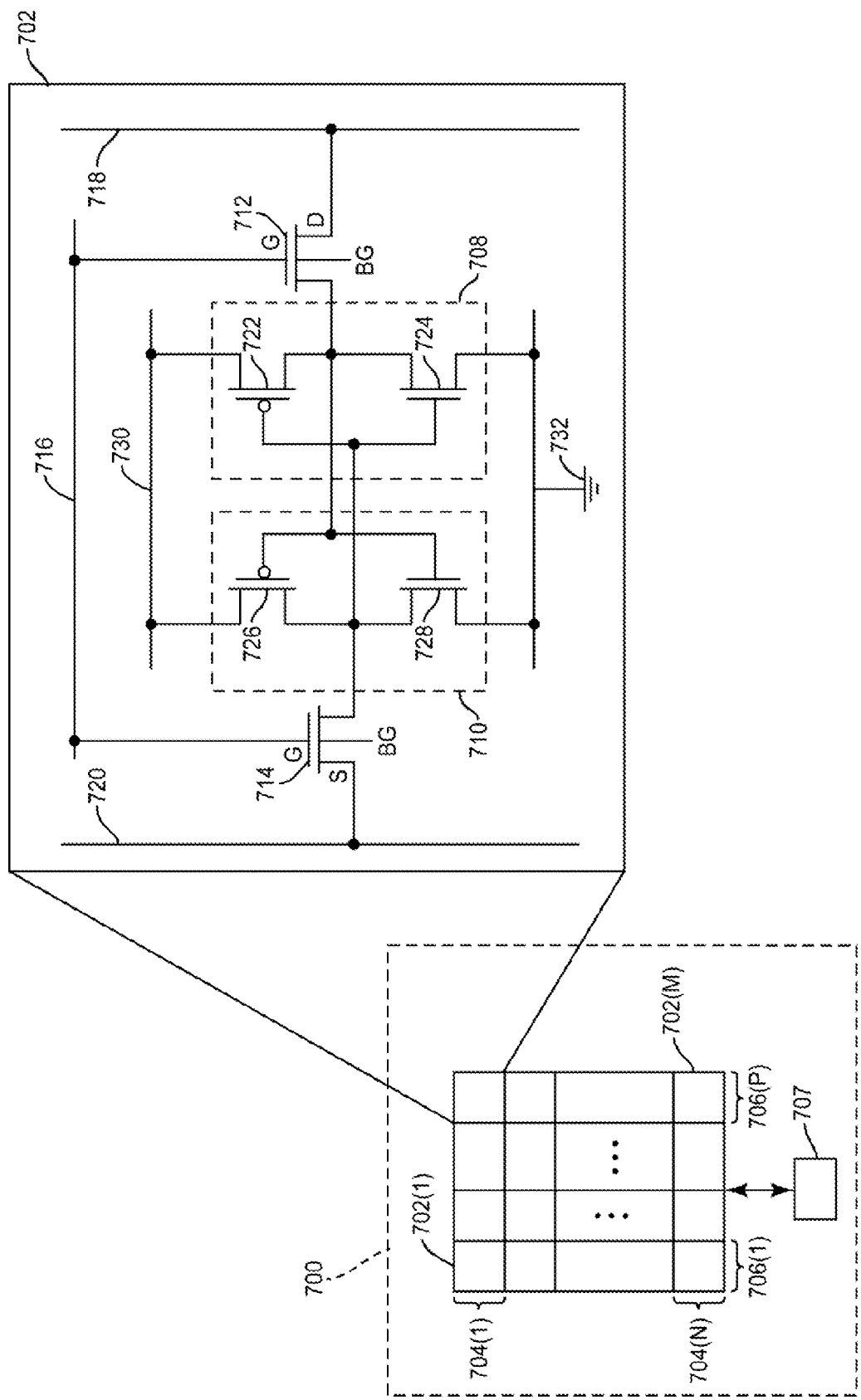
FIG. 7 illustrates a circuit diagram of an exemplary SRAM array and an exemplary SRAM bit cell designed using the process in FIG. 3.

In this regard, FIG. 7 illustrates an exemplary SRAM array 700 designed using the process 300 in FIG. 3. The SRAM array 700 includes multiple SRAM bit cells 702(1)-702(M) (referred to generally as the "SRAM bit cell 702"), wherein the SRAM bit cells 702(1)-702(M) are organized into rows 704(1)-704(N) and columns 706(1)-706(P). The SRAM array 700 also includes a biasing circuit 707 that is configured to provide the biasing to the SRAM bit cells 702(1)-702(M). A circuit diagram of an exemplary SRAM bit cell 702 is also provided in FIG. 7. The SRAM bit cell 702 includes a first inverter 708 and a second inverter 710. A first access transistor 712 is employed to access the first inverter 708, and a second access transistor 714 is employed to access the second inverter 710. A wordline 716 is configured to couple to a gate (G) of the first access transistor 712 and to a gate (G) of the second access transistor 714. A bitline 718 is configured to couple to a drain (D) of the first access transistor 712. A bit line bar 720 is configured to couple to a source (S) of the second access transistor 714. The first inverter 708 includes a first pull-up transistor 722 and a first pull-down transistor 724. The second inverter 710 includes a second pull-up transistor 726 and a second pull-down transistor 728. A voltage source 730 is configured to couple to the first and second pull-up transistors 722, 726, while the first and second pull-down transistors 724, 728 are configured to couple to ground 732. Notably, although the SRAM bit cell 702 is a standard six transistor (6T) SRAM bit cell in this aspect, other aspects may employ alternative designs for the SRAM bit cell 702, such as but not limited to, eight transistor (8T) or ten transistor (10T) SRAM bit cells.

With continuing reference to FIG. 7, the SRAM bit cell 702 is configured to be read from and written to via the bitline 718, while the wordline 716 is used to access the SRAM bit cell 702 for read and write operations. Further, the SRAM bit cell 702 is configured to store a single bit within first and second inverters 708, 710, wherein the first and second inverters 708, 710 are cross-coupled to retain an electrical charge representing the data value of the bit. In this manner, to read the SRAM bit cell 702, the bitline 718 is pre-charged to a logical '1' value and the bitline bar 720 is pre-charged to a logical '0' value, and the wordline 716 is configured to activate the first and second access transistors 712, 714. If the stored bit has a logical '1' value, the first inverter 708 is configured to maintain the logical '1' value on the bitline 718. Conversely, if the stored bit has a logical '0' value, the first inverter 708 is configured to maintain the logical '0' value to the bitline 718.

With continuing reference to FIG. 7, to write a bit to the SRAM bit cell 702, a value to be written to the SRAM bit cell 702 is provided by the bitline 718, while a complementary value is provided by a bitline bar 720. Thus, to write a logical '1' value, the wordline 716 activates the first and second access transistors 712, 714, while the bitline 718 provides a logical '1' value and the bitline bar 720 provides a logical '0' value. Such a configuration of logical values causes the first and second inverters 708, 710 to store a logical '1' value. Conversely, to write a logical '0' value, the bitline 718 and the bitline bar 720 provide a logical '0' value and a logical '1' value, respectively. Further, the wordline 716 activates the first and second access transistors 712, 714, and the configuration of the first and second inverters 708, 710 causes the first and second inverters 708, 710 to store a logical '0' value.

With continuing reference to FIG. 7, because the SRAM array 700 is designed using the process 300 in FIG. 3, each of the SRAM bit cells 702(1)-702(M) is configured to operate in a corresponding mode of operation based on which dynamic adaptive assist technique is used by the biasing circuit 707 to bias the SRAM array 700. In this aspect, each of the SRAM bit cells 702(1)-702(M) is configured to operate in a lower power (SVS) mode of operation, a nominal performance (medium) mode of operation, and a higher performance (turbo) mode of operation. Notably, the SRAM bit cells 702(1)-702(M) in alternative aspects may be configured to operate in other modes of operation. Further, various dynamic adaptive assist techniques may be employed to achieve each mode of operation.

In this regard, the wordline 716 may be over-driven so as to increase the activation speed of the first and second access transistors 712, 714, thereby biasing the SRAM bit cell 702 to operate in the nominal or higher performance mode according to the over-drive voltage applied to the wordline 716. Additionally, the wordline 716 may be under-driven so as to reduce the activation speed of the first and second access transistors 712, 714, thereby biasing the SRAM bit cell 702 to operate in the lower power mode. The SRAM bit cell 702 may also be biased to operate in a particular mode of operation by applying a bias voltage to the bitline 718. In this aspect, applying a higher bias voltage to the bitline 718 may enable the SRAM bit cell 702 to operate in the nominal or higher performance mode according to the bias voltage. Alternatively, applying a lower bias voltage to the bitline 718 may enable the SRAM bit cell 702 to operate in the lower power mode. Further, the SRAM bit cell 702 may also be biased to operate in a particular mode of operation by applying a bias voltage to a backgate (BG) of the first access transistor 712 or a backgate (BG) of the second access transistor 714. Notably, the SRAM bit cells 702(1)-702(M) are configured to achieve a substantially constant operational yield in each mode of operation irrespective of which dynamic adaptive assist technique is employed to achieve the desired mode. Therefore, because the SRAM array 700 requires fewer types of SRAM bit cells than number of modes of operation, the SRAM array 700 may be provided at a lower cost as compared to an SRAM array employing separate SRAM bit cell types designed to operate in one mode of operation, as in the $V_{MIN}$ design process 100 in FIG. 1.

SRAM arrays employing dynamic adaptive assist techniques according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
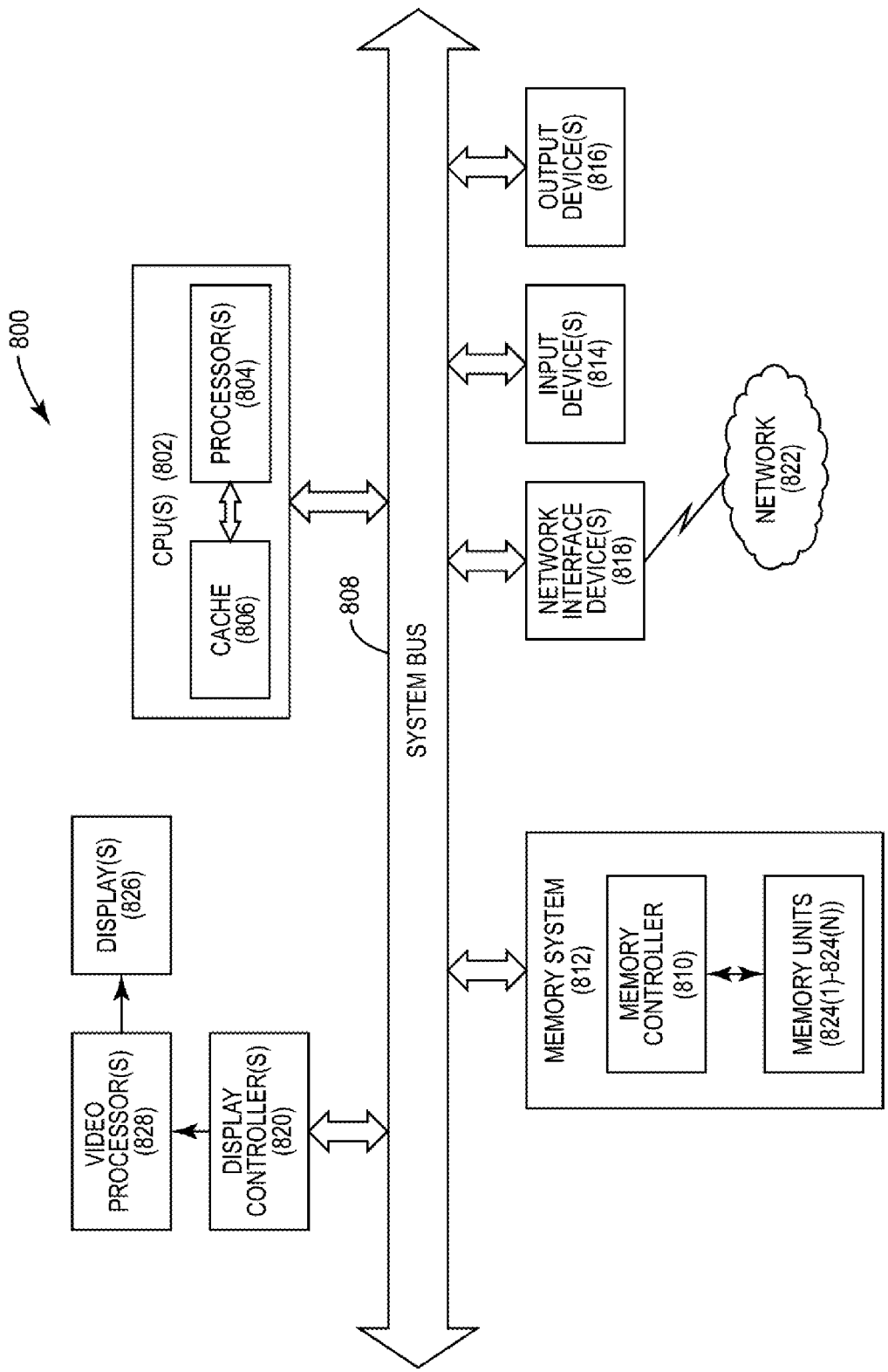
FIG. 8 is a block diagram of an exemplary processor-based system that can include the SRAM array in FIG. 7.

In this regard, FIG. 8 illustrates an example of a processor-based system 800 that can employ the SRAM array 700 illustrated in FIG. 7. In this example, the processor-based system 800 includes one or more central processing units (CPUs) 802, each including one or more processors 804. The CPU(s) 802 may be a master device. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, or one or more display controllers 820, as examples. The input device(s) 814 can include any type of input device, including but not limited to input keys, switches, voice processors, etc. The output device(s) 816 can include any type of output device, including but not limited to audio, video, other visual indicators, etc. The network interface device(s) 818 can be any device configured to allow exchange of data to and from a network 822. The network 822 can be any type of network, including but not limited to a wired or wireless network, a private or public network, a local area network (LAN), a wide local area network (WLAN), or the Internet. The network interface device(s) 818 can be configured to support any type of communications protocol desired. The memory system 812 can include one or more memory units 824(1)-824(N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of non-transitory computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for designing a static random access memory (SRAM) array with a substantially constant operational yield across a plurality of modes of operation, comprising:
   determining performance characteristics for each mode of operation of a plurality of modes of operation for a SRAM array;
   providing to the SRAM array a plurality of SRAM bit cells configured to operate in the plurality of modes of operation with a substantially constant operational yield based on one or more dynamic adaptive assist techniques, wherein the plurality of SRAM bit cells has a corresponding type, and a number of types of SRAM bit cells is less than a number of modes of operation; and
   biasing each SRAM bit cell of the plurality of SRAM bit cells to operate in one or more corresponding modes of operation of the plurality of modes of operation using the one or more dynamic adaptive assist techniques.

2. The method of claim 1, wherein biasing each SRAM bit cell of the plurality of SRAM bit cells comprises biasing each SRAM bit cell of the plurality of SRAM bit cells to operate in a higher performance mode using the one or more dynamic adaptive assist techniques.

3. The method of claim 1, wherein biasing each SRAM bit cell of the plurality of SRAM bit cells comprises biasing each SRAM bit cell of the plurality of SRAM bit cells to operate in a nominal performance mode using the one or more dynamic adaptive assist techniques.

4. The method of claim 1, wherein biasing each SRAM bit cell of the plurality of SRAM bit cells comprises biasing each SRAM bit cell of the plurality of SRAM bit cells to operate in a lower power mode using the one or more dynamic adaptive assist techniques.

5. The method of claim 1, wherein biasing each SRAM bit cell of the plurality of SRAM bit cells comprises over-driving a wordline corresponding to each SRAM bit cell of the plurality of SRAM bit cells.

6. The method of claim 1, wherein biasing each SRAM bit cell of the plurality of SRAM bit cells comprises under-driving a wordline corresponding to each SRAM bit cell of the plurality of SRAM bit cells.

7. The method of claim 1, wherein biasing each SRAM bit cell of the plurality of SRAM bit cells comprises providing a bias voltage to a bitline corresponding to each SRAM bit cell of the plurality of SRAM bit cells.

8. The method of claim 1, wherein biasing each SRAM bit cell of the plurality of SRAM bit cells comprises applying a bias voltage to a backgate corresponding to one or more transistors of a plurality of transistors of each SRAM bit cell of the plurality of SRAM bit cells.

9. A static random access memory (SRAM) array comprising:
    a biasing circuit;
    a plurality of SRAM bit cells, wherein:
        each SRAM bit cell of the plurality of SRAM bit cells configured to operate in a plurality of modes of operation with a substantially constant operational yield based on one or more dynamic adaptive assist techniques;
        the plurality of SRAM bit cells has a corresponding type, and a number of types of SRAM bit cells is less than a number of modes of operation; and
        each SRAM bit cell of the plurality of SRAM bit cells configured to be biased by the biasing circuit to operate in one or more corresponding modes of operation of the plurality of modes of operation using the one or more dynamic adaptive assist techniques.

10. The SRAM array of claim 9, wherein each SRAM bit cell of the plurality of SRAM bit cells is further configured to be biased to operate in a higher performance mode using the one or more dynamic adaptive assist techniques.

11. The SRAM array of claim 9, wherein each SRAM bit cell of the plurality of SRAM bit cells is further configured to be biased to operate in a nominal performance mode using the one or more dynamic adaptive assist techniques.

12. The SRAM array of claim 9, wherein each SRAM bit cell of the plurality of SRAM bit cells is further configured to be biased to operate in a lower power mode using the one or more dynamic adaptive assist techniques.

13. The SRAM array of claim 9, wherein each SRAM bit cell of the plurality of SRAM bit cells is further configured to be biased by over-driving a wordline corresponding to each SRAM bit cell of the plurality of SRAM bit cells.

14. The SRAM array of claim 9, wherein each SRAM bit cell of the plurality of SRAM bit cells is further configured to be biased by under-driving a wordline corresponding to each SRAM bit cell of the plurality of SRAM bit cells.

15. The SRAM array of claim 9, wherein each SRAM bit cell of the plurality of SRAM bit cells is further configured to be biased by providing a bias voltage to a bitline corresponding to each SRAM bit cell of the plurality of SRAM bit cells.

16. The SRAM array of claim 9, wherein each SRAM bit cell of the plurality of SRAM bit cells is further configured to be biased by applying a bias voltage to a backgate corresponding to one or more transistors of a plurality of transistors of each SRAM bit cell of the plurality of SRAM bit cells.

17. The SRAM array of claim 9 integrated into an integrated circuit (IC).

18. The SRAM array of claim 9 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

19. A static random access memory (SRAM) array, comprising:
    a means for determining performance characteristics for each mode of operation of a plurality of modes of operation for a SRAM array;
    a means for providing to the SRAM array a plurality of SRAM bit cells configured to operate in the plurality of modes of operation with a substantially constant operational yield based on one or more dynamic adaptive assist techniques, wherein the plurality of SRAM bit cells has a corresponding type, and a number of types of SRAM bit cells is less than a number of modes of operation; and
    a means for biasing each SRAM bit cell of the plurality of SRAM bit cells to operate in one or more corresponding modes of operation of the plurality of modes of operation using the one or more dynamic adaptive assist techniques.

20. The SRAM array of claim 19, wherein the means for biasing each SRAM bit cell of the plurality of SRAM bit cells comprises a means for biasing each SRAM bit cell of the plurality of SRAM bit cells to operate in a higher performance mode using the one or more dynamic adaptive assist techniques.

21. The SRAM array of claim 19, wherein the means for biasing each SRAM bit cell of the plurality of SRAM bit cells comprises a means for biasing each SRAM bit cell of the plurality of SRAM bit cells to operate in a nominal performance mode using the one or more dynamic adaptive assist techniques.

22. The SRAM array of claim 19, wherein the means for biasing each SRAM bit cell of the plurality of SRAM bit cells comprises a means for biasing each SRAM bit cell of the plurality of SRAM bit cells to operate in a lower power mode using the one or more dynamic adaptive assist techniques.

23. A non-transitory computer-readable medium having stored thereon computer executable instructions which, when executed by a processor, cause the processor to:
    determine performance characteristics for each mode of operation of a plurality of modes of operation for a static random access memory (SRAM) array;

provide to the SRAM array a plurality of SRAM bit cells configured to operate in the plurality of modes of operation with a substantially constant operational yield based on one or more dynamic adaptive assist techniques, wherein the plurality of SRAM bit cells has a corresponding type, and a number of types of SRAM bit cells is less than a number of modes of operation; and bias each SRAM bit cell of the plurality of SRAM bit cells to operate in one or more corresponding modes of operation of the plurality of modes of operation using the one or more dynamic adaptive assist techniques.

* * * * *